United States Patent
Kaiser et al.

(10) Patent No.: US 9,246,118 B2
(45) Date of Patent: Jan. 26, 2016

(54) ORGANIC ELECTROLUMINESCENT DEVICE

(75) Inventors: Joachim Kaiser, Darmstadt (DE); Horst Vestweber, Gilserberg (DE); Simone Leu, Dittelsheim-Hessloch (DE)

(73) Assignee: Merck Patent GmbH (DE)

( * ) Notice: Subject to any disclaimer, the term of this patent is extended or adjusted under 35 U.S.C. 154(b) by 156 days.

(21) Appl. No.: 13/497,639

(22) PCT Filed: Aug. 25, 2010

(86) PCT No.: PCT/EP2010/005218
§ 371 (c)(1),
(2), (4) Date: Mar. 22, 2012

(87) PCT Pub. No.: WO2011/035835
PCT Pub. Date: Mar. 31, 2011

(65) Prior Publication Data
US 2012/0267617 A1    Oct. 25, 2012

(30) Foreign Application Priority Data
Sep. 23, 2009   (DE) .................. 10 2009 042 680

(51) Int. Cl.
*H01L 51/50* (2006.01)
*H01L 51/00* (2006.01)

(52) U.S. Cl.
CPC ........ *H01L 51/5012* (2013.01); *H01L 51/5052* (2013.01); *H01L 51/006* (2013.01); *H01L 51/0058* (2013.01)

(58) Field of Classification Search
USPC .................. 428/690, 917; 313/504, 505, 506; 257/40, E51.05, E51.026, E51.032; 564/26, 426, 430, 432, 434; 585/27
See application file for complete search history.

(56) References Cited

U.S. PATENT DOCUMENTS

| | | |
|---|---|---|
| 5,085,947 A | 2/1992 | Saito et al. |
| 2004/0222739 A1 | 11/2004 | Chen et al. |
| 2006/0238120 A1* | 10/2006 | Miller et al. ........... C09K 11/06 313/506 |
| 2006/0243967 A1 | 11/2006 | Nomura et al. |
| 2007/0096644 A1 | 5/2007 | Nishimura et al. |
| 2009/0026939 A1 | 1/2009 | Kinoshita et al. |

FOREIGN PATENT DOCUMENTS

| | | | |
|---|---|---|---|
| EP | 1 533 290 | * 5/2005 | ............ C07C 15/62 |
| JP | 02-250292 A | 10/1990 | |
| JP | 05-182762 A | 7/1993 | |
| JP | 2001-155862 A | 6/2001 | |
| JP | 2007-123611 A | 5/2007 | |
| JP | 2009-032989 A | 2/2009 | |
| JP | 2009-076510 A | 4/2009 | |
| WO | WO-2009030981 A2 | 3/2009 | |

OTHER PUBLICATIONS

Chwang, et al., "Graded Mixed-Layer Organic Light-Emitting Devices", Applied Physics Letters, vol. 80, No. 5, pp. 725-727 (2002).
International Search Report for PCT/EP2010/005218 mailed Jan. 27, 2011.

* cited by examiner

*Primary Examiner* — Gregory Clark
(74) *Attorney, Agent, or Firm* — Drinker Biddle & Reath LLP

(57) ABSTRACT

The present invention relates to organic electroluminescent devices which, in addition to the emitting layer, have a further layer which comprises the same materials as the emitting layer.

15 Claims, No Drawings

ORGANIC ELECTROLUMINESCENT DEVICE

CROSS-REFERENCE TO RELATED APPLICATIONS

This application is a national stage application (under 35 U.S.C. §371) of PCT/EP2010/005218, filed Aug. 25, 2010, which claims benefit of German application 10 2009 042 680.9, filed Sep. 23, 2009.

The present invention relates to an organic electroluminescent device comprising at least one emitting layer comprising at least two materials A and B, and, in addition to the emitting layer, at least one further layer which comprises the same materials A and B as the emitting layer, where the material that is present in the lower proportion in the emitting layer is present in the higher proportion in the further layer.

The structure of organic electroluminescent devices (OLEDs) in which organic semiconductors are employed as functional materials is described, for example, in U.S. Pat. No. 4,539,507, U.S. Pat. No. 5,151,629, EP 0676461 and WO 98/27136. An OLED in accordance with the prior art usually comprises a hole-injection layer, one or more hole-transport layers, one or more emitting layers, optionally a hole-blocking layer, one or more electron-transport layers and an electron-injection layer between the anode and cathode, where each of these layers is not necessarily present. The emitting layer here is generally a doped layer, i.e. a mixture of at least one host material (matrix material) and at least one dopant. Special device structures, such as graded doping, or emitting layers which are built up from a plurality of individual layers, where, for example, different host materials can be used for the same dopant or different doping concentrations are used in the different layers, are also known. In doped layers, the totality of the dopants always has a lower concentration than the totality of the host materials. The doping concentration is usually between 5 and 20% by vol. in phosphorescent emitter layers and is usually between 0.5 and 10% by vol. in fluorescent emitter layers.

The hole-transport layers used are usually pure layers comprising a hole-transport material, generally arylamine derivatives, or use is made of hole-transport materials which are doped with p-dopants, i.e. oxidising materials, in order to increase the conductivity.

In general, there continues to be a need for improvement with respect to the efficiency, operating voltage and operating lifetime of organic electroluminescent devices.

SUMMARY OF THE INVENTION

Surprisingly, it has been found that the emission properties in an organic electroluminescent device which has an emitting layer comprising at least one dopant and at least one host material can be improved if an additional layer which likewise consists of a mixture of the same dopant and the same host material as in the emitting layer is introduced, where the dopant is present in a higher proportion in the mixture than the host material in this additional layer.

The present invention thus relates to an organic electroluminescent device which comprises an emitting layer which consists of a mixture of at least two materials A and B in an unequal mixing ratio, where the concentration of material A is lower than the concentration of material B, and which comprises an additional layer which consists of a mixture of the same materials A and B as the emitting layer, characterised in that material A, which has the lower proportion of the two materials in the emitting layer, is present in a higher proportion than material B in this additional layer.

A DETAILED DESCRIPTION OF THE INVENTION

The additional layer here is preferably a non-luminous layer, i.e. this layer exhibits no emission during operation of the OLED.

In a preferred embodiment of the invention, material A, which has a lower concentration, has a concentration of less than 30% by vol., particularly preferably less than 10% by vol., very particularly preferably less than 7% by vol., in the emitting layer.

In a preferred embodiment of the invention, material A which is present in lower concentration in the emitting layer is an emitting material. This preferably contributes at least 80%, preferably at least 90%, of the emission from this emitter layer. The proportion of the emission can be estimated from the electroluminescence spectrum of the OLED compared with the electroluminescence spectrum of an OLED in which material A is omitted.

In a particularly preferred embodiment of the invention, emitting material A is a fluorescent material.

In a further preferred embodiment of the invention, material B of higher concentration in the emitting layer has a proportion of greater than 30% by vol., particularly preferably greater than 50% by vol., very particularly preferably greater than 70% by vol.

In a particularly preferred embodiment of the invention, the emitting layer consists of precisely one host material B which is doped with precisely one emitting dopant A, where host material B is the material of higher concentration. In this case, the concentration of host material B is preferably greater than 70% by vol., particularly preferably greater than 90% by vol., very particularly preferably greater than 93% by vol.

In accordance with the invention, the organic electroluminescent device has an additional layer which comprises the same materials A and B as the emitting layer, where material A is present in higher proportion than material B in this additional layer. In a preferred embodiment, the proportion of material A, which is present in lower proportion in the emitting layer, in the additional layer is greater than 50% by vol., particularly preferably greater than 70% by vol., very particularly preferably greater than 80% by vol.

Correspondingly, the proportion of material B in the additional layer is preferably less than 50% by vol., particularly preferably less than 30% by vol., very particularly preferably less than 20% by vol.

In a preferred embodiment of the invention, the additional layer is directly adjacent to the emitting layer, particularly preferably on the anode side.

In a further preferred embodiment of the invention, the emitting layer is a blue-emitting layer or a green-emitting layer. The emitting layer is particularly preferably a blue-emitting layer, very particularly preferably a blue-fluorescent layer. Overall, the organic electroluminescent device can be a monochrome organic electroluminescent device or a white-emitting organic electroluminescent device.

The organic electroluminescent device according to the invention comprises an anode, a cathode and at least one emitting layer and the additional layer described above, where the said layers are arranged between the anode and the cathode. The organic electroluminescent device does not necessarily have to comprise only layers built up from organic or organo-metallic materials. Thus, it is also possible for the anode, cathode and/or one or more layers to comprise inorganic materials or to be built up entirely from inorganic materials.

The organic electroluminescent device according to the invention can comprise fluorescent or phosphorescent compounds.

A phosphorescent compound in the sense of this invention, as present in the phosphorescent emitter layers of the organic device according to the invention, is a compound which exhibits luminescence from an excited state of relatively high spin multiplicity, i.e. a spin state >1, in particular from an excited triplet state, at room temperature. For the purposes of this invention, all luminescent transition-metal complexes from the second and third transition-metal series, in particular all luminescent iridium and platinum compounds, are to be regarded as phosphorescent compounds.

A fluorescent compound in the sense of this invention, as present in a blue-fluorescent emitter layer, is a compound which exhibits luminescence from an excited singlet state at room temperature. For the purposes of this invention, all luminescent compounds which are built up only from the elements C, H, N, O, S, F, B and P are, in particular, to be taken to mean fluorescent compounds.

In a preferred embodiment of the invention, material A, which is present in lower concentration in the emitting layer, is a hole-transport material. A hole-transport material in the sense of the present invention is defined as a material which has an HOMO (highest occupied molecular orbital) of >−5.6 eV. The HOMO is preferably >−5.4 eV, particularly preferably >−5.2 eV. The HOMO here is determined as described in general terms in the working examples in Example 1.

In a preferred embodiment of the invention, the hole-conducting material A employed is an aromatic monoamine, an aromatic diamine, an aromatic triamine or an aromatic tetramine, in particular an aromatic monoamine or an aromatic diamine, where at least one substituent on the aromatic amine particularly preferably represents a condensed aromatic group.

Preferred aromatic amines which can be employed as material A are the compounds of the following formulae (1) to (7):

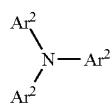

formula (1)

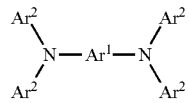

formula (2)

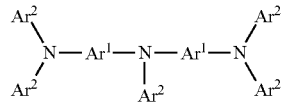

formula (3)

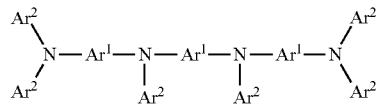

formula (4)

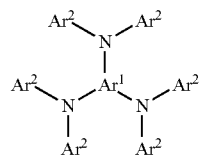

formula (5)

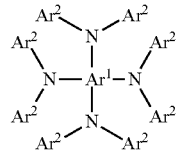

formula (6)

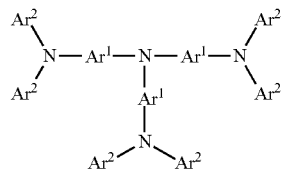

formula (7)

where the following applies to the symbols used:

$Ar^1$ is on each occurrence, identically or differently, a divalent, trivalent or tetravalent aromatic or heteroaromatic ring system having 5 to 60 aromatic ring atoms, which may be substituted by one or more radicals $R^1$;

$Ar^2$ is on each occurrence, identically or differently, a monovalent aromatic or heteroaromatic ring system having 5 to 60 aromatic ring atoms, which may be substituted by one or more radicals $R^1$; two groups $Ar^2$ here which are bonded to the same nitrogen atom or one group $Ar^1$ with one group $Ar^2$ which are bonded to the same nitrogen atom may be linked to one another by a single bond or a bridge selected from the group consisting of $B(R^1)$, $C(R^1)_2$, $Si(R^1)_2$, $C=O$, $C=NR^1$, $C=C(R^1)_2$, O, S, $S=O$, $SO_2$, $N(R^1)$, $P(R^1)$ and $P(=O)R^1$;

$R^1$ is on each occurrence, identically or differently, H, D, F, Cl, Br, I, CHO, $C(=O)Ar^3$, $P(=O)(Ar^3)_2$, $S(=O)Ar^3$, $S(=O)_2Ar^3$, $CR^2=CR^2Ar^3$, CN, $NO_2$, $Si(R^2)_3$, $B(OR^2)_2$, $B(R^2)_2$, $B(N(R^2)_2)_2$, $OSO_2R^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals $R^2$, where one or more non-adjacent $CH_2$ groups may be replaced by $R^2C=CR^2$, $C\equiv C$, $Si(R^2)_2$, $Ge(R^2)_2$, $Sn(R^2)_2$, $C=O$, $C=S$, $C=Se$, $C=NR^2$, $P(=O)(R^2)$, SO, $SO_2$, NR², O, S or CONR² and where one or more H atoms may be replaced by F, Cl, Br, I, CN or NO₂, or an aromatic or heteroaromatic ring system having 5 to 60 aromatic ring atoms, which may in each case be substituted by one or more radicals R², or an aryloxy or heteroaryloxy group having 5 to 60 aromatic ring atoms, which may be substituted by one or more radicals R², or a combination of these systems; two or more adjacent substituents R¹ here may also form a mono- or polycyclic, aliphatic or aromatic ring system with one another;

Ar³ is on each occurrence, identically or differently, an aromatic or heteroaromatic ring system having 5 to 40 aromatic ring atoms, which may be substituted by one or more radicals R²;

R² is on each occurrence, identically or differently, H, D, CN or an aliphatic, aromatic and/or heteroaromatic hydrocarbon radical having 1 to 20 C atoms, in which, in addition, H atoms may be replaced by F; two or more adjacent substituents R² here may also form a mono- or polycyclic, aliphatic or aromatic ring system with one another.

If two groups Ar² or one group Ar¹ with one group Ar² which are each bonded to the same nitrogen atom are linked to one another by a single bond, a carbazole is thus formed.

Ar¹ here is a divalent group in the compounds of the formulae (2), (3), (4) and (7) and a trivalent group in the compounds of the formula (5) and a tetravalent group in the compounds of the formula (6).

An aryl group in the sense of this invention contains at least 6 C atoms; a heteroaryl group in the sense of this invention contains at least 2 C atoms and at least one heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group. A condensed aryl or heteroaryl group here is taken to mean a group in which at least two aryl or heteroaryl groups are condensed onto one another through a common edge, for example naphthalene, anthracene, pyrene, quinoline, isoquinoline, etc.

An aromatic ring system in the sense of this invention contains at least 6 C atoms in the ring system. A heteroaromatic ring system in the sense of this invention contains at least 2 C atoms and at least one heteroatom in the ring system, with the proviso that the sum of C atoms and heteroatoms is at least 5. The heteroatoms are preferably selected from N, O and/or S. An aromatic or heteroaromatic ring system in the sense of this invention is intended to be taken to mean a system which does not necessarily contain only aryl or heteroaryl groups, but instead in which, in addition, a plurality of aryl or heteroaryl groups may be interrupted by a short non-aromatic unit (preferably less than 10% of the atoms other than H), such as, for example, an sp³-hybridised C, N or O atom or a carbonyl group. Thus, for example, systems such as 9,9'-spirobifluorene, 9,9-diarylfluorene, triarylamine, diaryl ether, stilbene, benzophenone, etc., are also intended to be taken to be aromatic ring systems in the sense of this invention. An aromatic or heteroaromatic ring system is likewise taken to mean systems in which a plurality of aryl or heteroaryl groups are linked to one another by single bonds, for example biphenyl, terphenyl or bipyridine.

For the purposes of the present invention, a $C_1$- to $C_{40}$-alkyl group, in which, in addition, individual H atoms or CH₂ groups may be substituted by the above-mentioned groups, is particularly preferably taken to mean the radicals methyl, ethyl, n-propyl, i-propyl, n-butyl, i-butyl, s-butyl, t-butyl, 2-methylbutyl, n-pentyl, s-pentyl, t-pentyl, 2-pentyl, cyclopentyl, n-hexyl, s-hexyl, t-hexyl, 2-hexyl, 3-hexyl, cyclohexyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, trifluoromethyl, pentafluoroethyl and 2,2,2-trifluoroethyl. A $C_2$- to $C_{40}$-alkenyl group is preferably taken to mean ethenyl, propenyl, butenyl, pentenyl, cyclopentenyl, hexenyl, cyclohexenyl, heptenyl, cycloheptenyl, octenyl or cyclooctenyl. A $C_2$- to $C_{40}$-alkynyl group is preferably taken to mean ethynyl, propynyl, butynyl, pentynyl, hexynyl, heptynyl or octynyl. A $C_1$ to $C_{40}$-alkoxy group is particularly preferably taken to mean methoxy, trifluoromethoxy, ethoxy, n-propoxy, i-propoxy, n-butoxy, i-butoxy, s-butoxy, t-butoxy or 2-methylbutoxy. An aromatic or heteroaromatic ring system having 5-60 aromatic ring atoms, which may also in each case be substituted by the above-mentioned radicals R and which may be linked to the aromatic or heteroaromatic ring system via any desired positions, is taken to mean, in particular, groups derived from benzene, naphthalene, anthracene, phenanthrene, benzanthracene, benzophenanthrene, pyrene, chrysene, perylene, fluoranthene, benzofluoranthene, naphthacene, pentacene, benzopyrene, biphenyl, biphenylene, terphenyl, terphenylene, fluorene, benzofluorene, dibenzofluorene, spiro-bifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

In a preferred embodiment of the invention, at least one of the groups Ar¹ and/or Ar² in compounds of the formulae (1) to (7) represents a condensed aromatic or heteroaromatic ring system having more than 10 aromatic ring atoms.

At least one group $Ar^1$ in compounds of the formulae (2) to (7) or at least one group $Ar^2$ in compounds of the formula (1) particularly preferably represents a condensed aromatic or heteroaromatic ring system having 14 to 40 aromatic ring atoms, particularly preferably having 14 to 30 aromatic ring atoms. The condensed aromatic or heteroaromatic ring system is very particularly preferably selected from the group consisting of anthracene, chrysene, pyrene, perylene, naphthacene, pentacene, benzofluorene, dibenzofluorene, cis- or trans-mono benzoindenofluorene or cis- or transdibenzoindenofluorene.

In a preferred embodiment of the invention, the group $Ar^2$ in compounds of the formulae (2) to (7) is, identically or differently on each occurrence, an aromatic or heteroaromatic ring system having 5 to 18 aromatic ring atoms, particularly preferably having 6 to 12 aromatic ring atoms, which may in each case be substituted by one or more radicals $R^1$. $Ar^2$ is very particularly preferably selected, identically or differently on each occurrence, from the group consisting of phenyl, 1-naphthyl, 2-naphthyl or ortho-, meta- or para-biphenyl, each of which may be substituted by one or more radicals $R^1$. In compounds of the formula (1), it is preferred for two of the groups $Ar^2$ to be as defined above and for the third group $Ar^2$ to be a condensed aromatic or heteroaromatic ring system having more than 10 aromatic ring atoms.

Preferred examples thereof are aromatic 2- or 9-anthracenamines, aromatic 2,6- or 9,10-anthracenediamines, aromatic 1-pyrenamines, aromatic 1,6-pyrenediamines, aromatic chrysenamines or aromatic chrysenediamines, benzoindenofluorenamines or benzoindenofluorenediamines, for example in accordance with WO 08/006,449, and dibenzoindenofluorenamines or dibenzoindenofluorenediamines, for example in accordance with WO 07/140,847.

In a further preferred embodiment of the invention, material B, which is present in higher proportion in the emitting layer, is an electron-transporting material. This preferably has an LUMO (lowest unoccupied molecular orbital) of <−2.3 eV, particularly preferably <−2.5 eV. The LUMO here is determined as described in general terms in the working examples in Example 1.

Suitable materials B which can be employed as host materials (matrix materials) for the fluorescent dopants, in particular for the above-mentioned dopants, are selected, for example, from the classes of the oligoarylenes (for example 2, 2',7,7'-tetraphenylspirobifluorene in accordance with EP 676461 or dinaphthylanthracene), in particular the oligoarylenes containing condensed aromatic groups, the oligoarylenevinylenes (for example DPVBi or spiro-DPVBi in accordance with EP 676461), the polypodal metal complexes (for example in accordance with WO 04/081017), the electron-conducting compounds, in particular ketones, phosphine oxides, sulfoxides, etc. (for example in accordance with WO 05/084081 and WO 05/084082), the atropisomers (for example in accordance with WO 06/048268), the boronic acid derivatives (for example in accordance with WO 06/117052), the benzanthracene derivatives (for example benz-[a]anthracene derivatives in accordance with WO 08/145,239) and the benzophenanthrene derivatives (for example benzo[c]phenanthrene derivatives in accordance with the unpublished application DE 102009005746.3). Particularly preferred host materials are selected from the classes of the oligoarylenes, comprising naphthalene, anthracene, benzanthracene, in particular benz[a]anthracene, benzophenanthrene, in particular benzo[c]phenanthrene, and/or pyrene, or atropisomers of these compounds. An oligoarylene in the sense of this invention is intended to be taken to mean a compound in which at least three aryl or arylene groups are bonded to one another.

Particularly preferred materials B are compounds of the following formula (8):

$$Ar^4\text{-Ant-}Ar^4 \qquad \text{formula (8)}$$

where $R^1$ has the meaning indicated above, and the following applies to the other symbols used:

Ant stands for an anthracene group which is substituted in the 9- and 10-position by the groups $Ar^4$ and which may furthermore be substituted by one or more substituents $R^1$;

$Ar^4$ is, identically or differently on each occurrence, an aromatic or heteroaromatic ring system having 5 to 60 aromatic ring atoms, which may be substituted by one or more radicals $R^1$.

In a preferred embodiment of the invention, at least one of the groups $Ar^4$ contains a condensed aryl group having 10 or more aromatic ring atoms. Preferred groups $Ar^4$ are selected, identically or differently on each occurrence, from the group consisting of phenyl, 1-naphthyl, 2-naphthyl, anthracenyl, ortho-, meta- or para-biphenyl, phenylene-1-naphthyl, phenylene-2-naphthyl, phenanthrenyl, benz[a]anthracenyl or benzo[c]phenanthrenyl, each of which may be substituted by a radical $R^1$.

The layer thickness of the emitting layer is preferably between 5 and 60 nm, particularly preferably between 10 and 30 nm.

The layer thickness of the additional layer which comprises the same materials as the emitting layer is preferably between 1 and 50 nm, particularly preferably between 3 and 20 nm.

The preferred embodiments of the further layers of the OLED are indicated below.

If further emitting layers are present, in general all materials as used in accordance with the prior art can be used in these emitting layers.

In a preferred embodiment of the invention, the device is a white-emitting organic electroluminescent device. This is characterised in that it emits light having CIE 1931 colour coordinates in the range from 0.28/0.29 to 0.45/0.41.

If the organic electroluminescent device has precisely two emitting layers, the second emitter layer is preferably a yellow- or orange-phosphorescent emitter layer. The first layer is, as already indicated above as generally preferred, preferably a blue-fluorescent emitter layer. The yellow- or orange-phosphorescent layer here is preferably arranged on the anode side and the blue-fluorescent layer on the cathode side. The additional layer is then preferably a layer which comprises the same materials as the blue-fluorescent layer. This layer is preferably arranged on the anode side of the blue-fluorescent layer and lies as interlayer between the blue-fluorescent emitter layer and the yellow- or orange-phosphorescent emitter layer.

In a preferred embodiment of the invention, the electroluminescent device according to the invention has at least three emitting layers.

If the organic electroluminescent device has three emitting layers, one of these layers is preferably a red- or orange-phosphorescent emitter layer and one of the layers is a green-phosphorescent emitter layer. The first layer is, as already indicated above as generally preferred, preferably a blue-fluorescent emitter layer. In a preferred embodiment of the invention, the red- or orange-phosphorescent layer is on the anode side, the blue-fluorescent layer is on the cathode side, and the green-phosphorescent layer lies between the red-phosphorescent layer and the blue-fluorescent layer. The additional layer is then preferably a layer which comprises the same materials as the blue-fluorescent layer. This layer is preferably arranged on the anode side of the blue-fluorescent layer and lies as interlayer between the blue-fluorescent emitter layer and the green-phosphorescent emitter layer.

It is also possible for the organic electroluminescent device to have two or more interlayers instead of one between the fluorescent and phosphorescent emitter layers, as described, for example, in the unpublished application DE 102009017064.2. In this case, the additional layer, which has the same materials A and B as the blue-fluorescent layer, is one of these interlayers and is preferably directly adjacent to the blue-fluorescent layer.

It is also possible for the organic electroluminescent device to have more than three emitter layers.

A yellow-emitting layer here is taken to mean a layer whose photoluminescence maximum is in the range from 540 to 570 nm. An orange-emitting layer is taken to mean a layer whose photoluminescence maximum is in the range from 570 to 600 nm. A red-emitting layer is taken to mean a layer whose photoluminescence maximum is in the range from 600 to 750 nm. A green-emitting layer is taken to mean a layer whose photoluminescence maximum is in the range from 490 to 540 nm. A blue-emitting layer is taken to mean a layer whose photoluminescence maximum is in the range from 440 to 490 nm. The photoluminescence maximum here is determined by measurement of the photoluminescence spectrum of the layer having a layer thickness of 50 nm.

Suitable materials for the phosphorescent emitter layers in the white-emitting organic electroluminescent device are generally all phosphorescent emitters and all matrix materials for phosphorescent emitters as are used in accordance with the prior art, where the phosphorescent emitters are preferably cyclometallated iridium and platinum complexes. In particular, it is known to the person skilled in the art which phosphorescent complexes emit with which emission colour.

Apart from the cathode, anode, the emitting layer and the additional layer which comprises the same materials as the emitting layer, the organic electroluminescent device may also comprise further layers. These are selected, for example, from in each case one or more hole-injection layers, hole-transport layers, hole-blocking layers, electron-transport layers, electron-injection layers, electron-blocking layers, exciton-blocking layers, charge-generation layers and/or organic or inorganic p/n junctions. In addition, interlayers may be present between a plurality of emitting layers. Furthermore, the layers, in particular the charge-transport layers, may also be doped. Doping of the layers may be advantageous for improved charge transport. However, it should be pointed out that each of these layers does not necessarily have to be present and the choice of layers is always dependent on the compounds used.

The use of layers of this type is known to the person skilled in the art, and he will be able to use all materials in accordance with the prior art that are known for layers of this type for this purpose without inventive step.

The cathode of the electroluminescent device according to the invention preferably comprises metals having a low work function, metal alloys or multilayered structures comprising different metals, such as, for example, alkaline-earth metals, alkali metals, main-group metals or lanthanoids (for example Ca, Ba, Mg, Al, In, Mg, Yb, Sm, etc.). In the case of multi-layered structures, further metals which have a relatively high work function, such as, for example, Ag, may also be used in addition to the said metals, in which case combinations of the metals, such as, for example, Ca/Ag or Ba/Ag, are generally used. Preference is likewise given to metal alloys, in particular alloys comprising an alkali metal or alkaline-earth metal and silver, particularly preferably an alloy of Mg and Ag. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides or carbonates (for example LiF, $Li_2O$, CsF, $Cs_2CO_3$, $BaF_2$, MgO, NaF, etc.). The layer thickness of this layer is preferably between 0.5 and 5 nm.

The anode of the electroluminescent device according to the invention preferably comprises materials having a high work function. The anode preferably has a work function of greater than 4.5 eV vs. vacuum. Suitable for this purpose are on the one hand metals having a high redox potential, such as, for example, Ag, Pt or Au. On the other hand, metal/metal oxide electrodes (for example Al/Ni/$NiO_x$, Al/$PtO_x$) may also be preferred. At least one of the electrodes here must be transparent in order to facilitate the coupling-out of light. A preferred structure uses a transparent anode. Preferred anode materials here are conductive mixed metal oxides. Particular preference is given to indium tin oxide (ITO) or indium zinc oxide (IZO). Preference is furthermore given to conductive, doped organic materials, in particular conductive doped polymers.

The device is correspondingly (depending on the application) structured, provided with contacts and finally hermetically sealed, since the lifetime of devices of this type is drastically shortened in the presence of water and/or air.

It is generally possible to employ all further materials as employed in accordance with the prior art in organic electroluminescent devices, also in combination with the layers according to the invention comprising materials A and B.

Suitable charge-transport materials, as can be used in the hole-injection or hole-transport layer or in the electron-transport layer of the organic electroluminescent device according to the invention, are, for example, the compounds disclosed in Y. Shirota et al., *Chem. Rev.* 2007, 107(4), 953-1010, or other materials as employed in accordance with the prior art in these layers.

Examples of preferred hole-transport materials which can be used in a hole-transport or hole-injection layer in the electroluminescent device according to the invention are indenofluorenamines and derivatives (for example in accordance with WO 06/122630 or WO 06/100896), the amine derivatives disclosed in EP 1661888, hexaazatriphenylene derivatives (for example in accordance with WO 01/049806), amine derivatives containing condensed aromatic ring systems (for example in accordance with U.S. Pat. No. 5,061,569), the amine derivatives disclosed in WO 95/09147, monobenzo-indenofluorenamines (for example in accordance with WO 08/006,449) or dibenzoindenofluorenamines (for example in accordance with WO 07/140,847). Hole-transport and hole-injection materials which are furthermore suitable are derivatives of the compounds depicted above, as disclosed in JP 2001/226331, EP 676461, EP 650955, WO 01/049806, U.S. Pat. No. 4,780,536, WO 98/30071, EP 891121, EP 1661888, JP 2006/253445, EP 650955, WO 06/073054 and U.S. Pat. No. 5,061,569.

Suitable hole-transport or hole-injection materials are furthermore, for example, the materials listed in the following table.

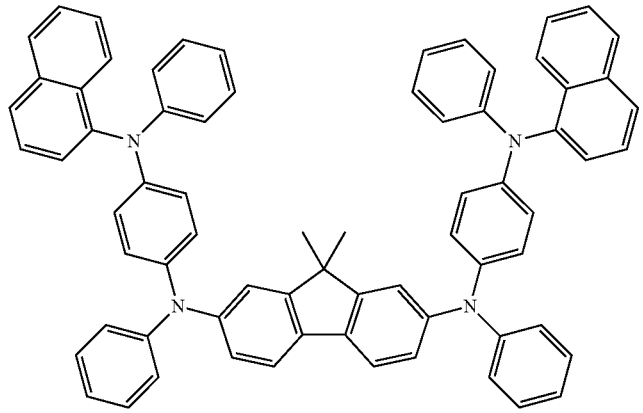 [SMILES: CC1(C)c2cc(N(c3ccccc3)c3ccc(N(c4ccccc4)c4cccc5ccccc45)cc3)ccc2-c2ccc(N(c3ccccc3)c3ccc(N(c4ccccc4)c4cccc5ccccc45)cc3)cc21]

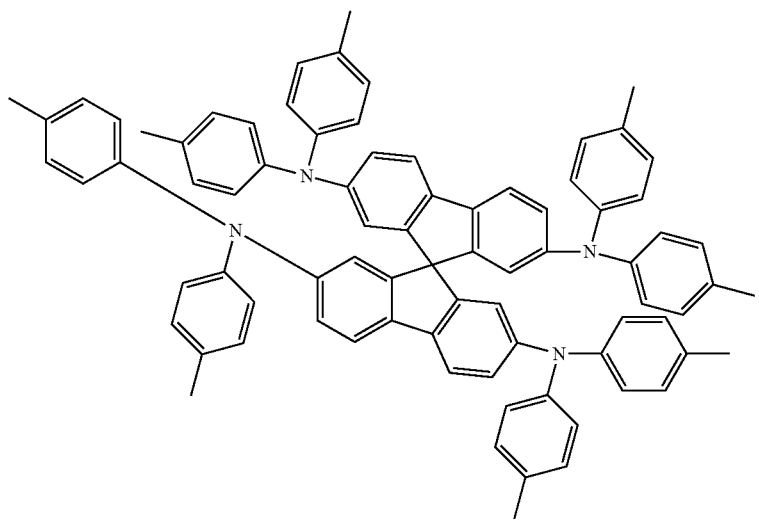

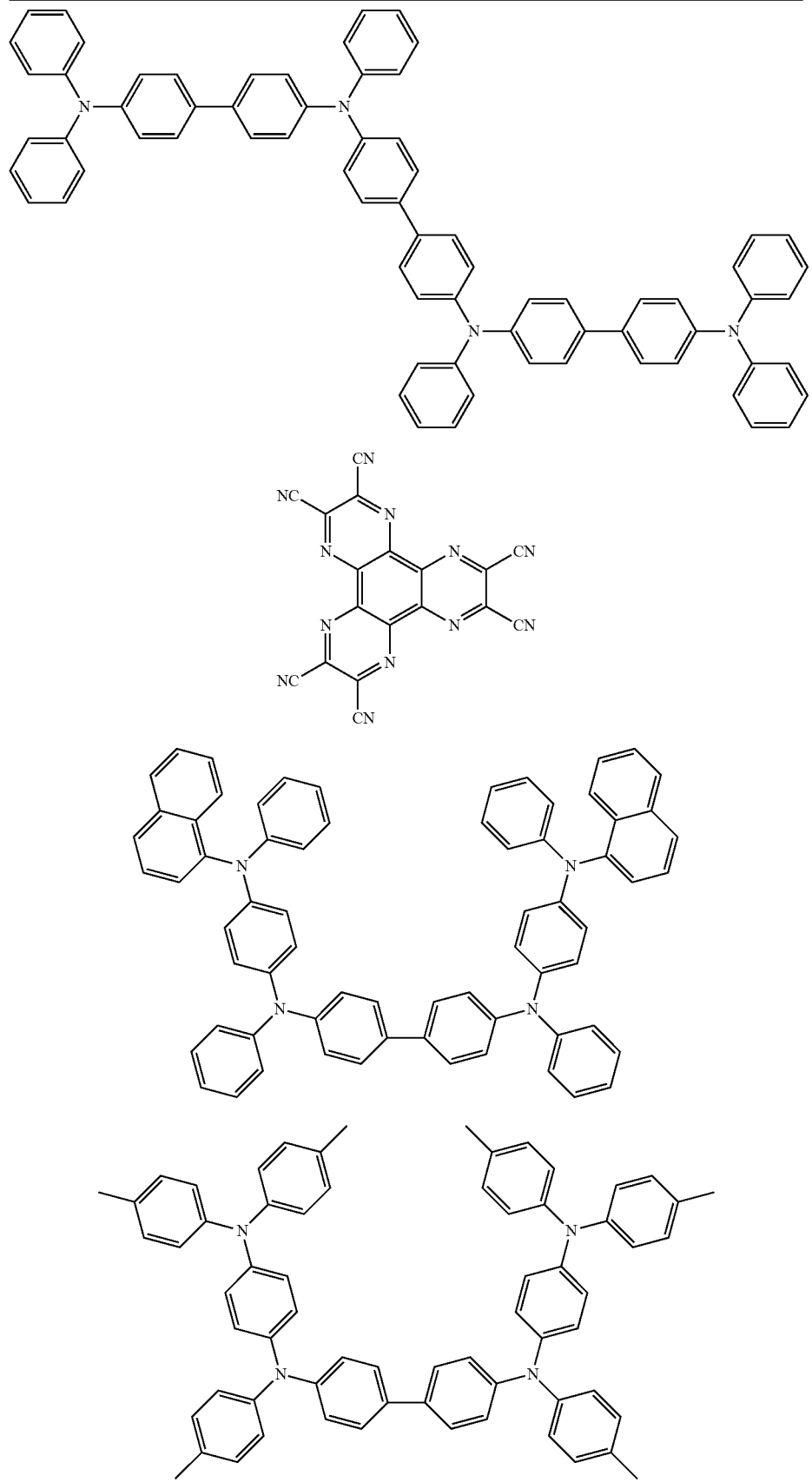

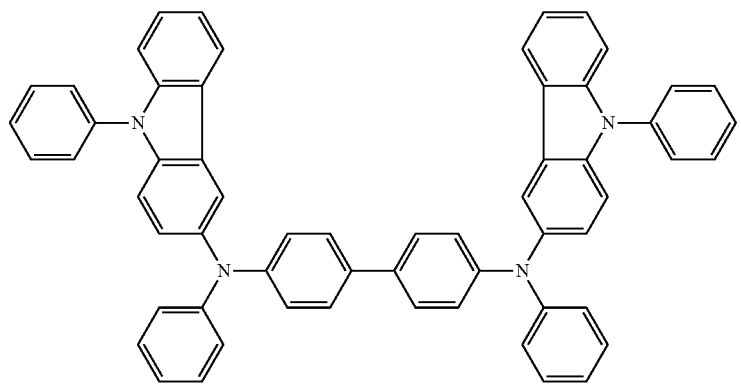 [SMILES: c1ccc(N(c2ccc(-c3ccc(N(c4ccccc4)c4ccc5c(c4)c4ccccc4n5-c4ccccc4)cc3)cc2)c2ccc3c(c2)c2ccccc2n3-c2ccccc2)cc1]
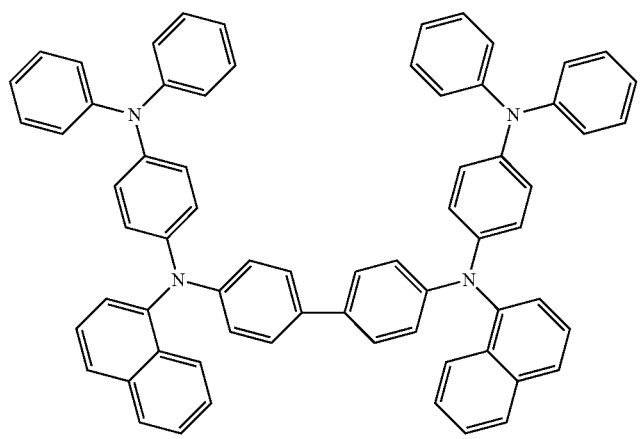 [SMILES: c1ccc(N(c2ccccc2)c2ccc(N(c3ccc(-c4ccc(N(c5ccc(N(c6ccccc6)c6ccccc6)cc5)c5cccc6ccccc56)cc4)cc3)c3cccc4ccccc34)cc2)cc1]
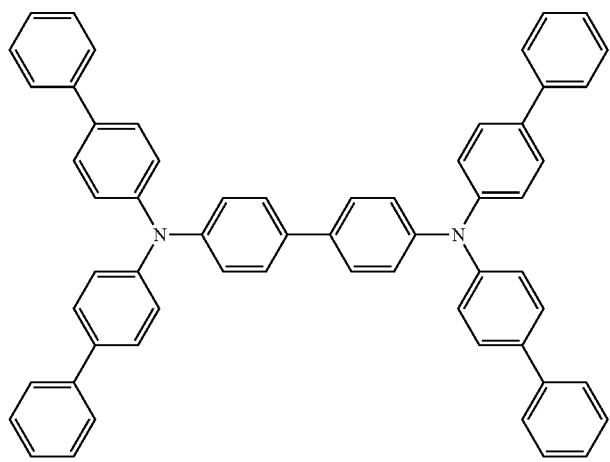 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]

-continued
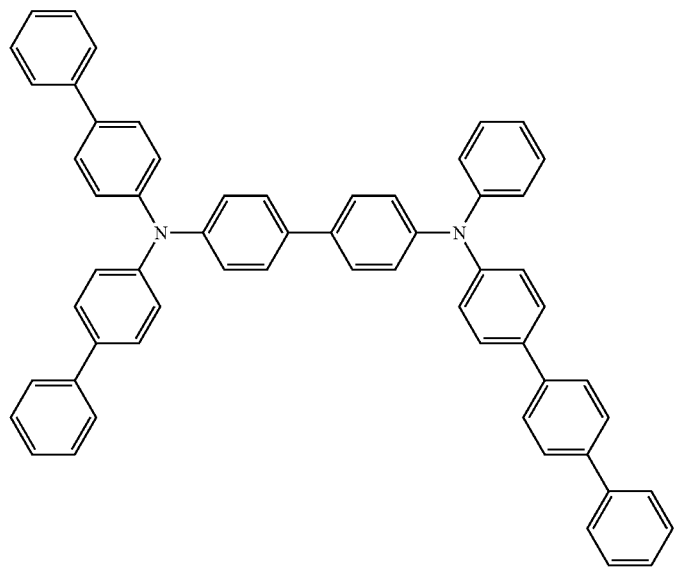 [SMILES: c1ccc(-c2ccc(-c3ccc(N(c4ccccc4)c4ccc(-c5ccc(N(c6ccc(-c7ccccc7)cc6)c6ccc(-c7ccccc7)cc6)cc5)cc4)cc3)cc2)cc1]
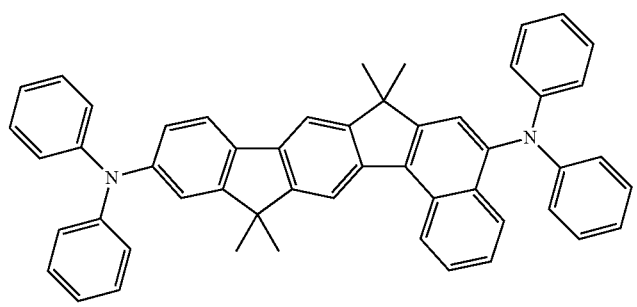 [SMILES: CC1(C)c2cc(N(c3ccccc3)c3ccccc3)ccc2-c2cc3c(cc21)-c1c(cc(N(c2ccccc2)c2ccccc2)c2ccccc12)C3(C)C]
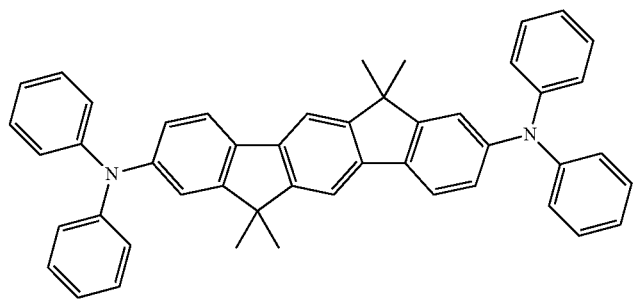 [SMILES: CC1(C)c2cc(N(c3ccccc3)c3ccccc3)ccc2-c2cc3c(cc21)-c1ccc(N(c2ccccc2)c2ccccc2)cc1C3(C)C]
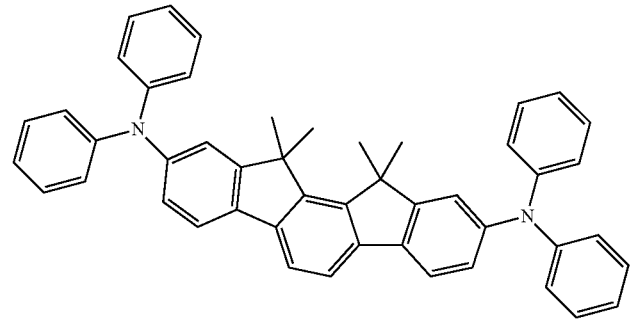 [SMILES: CC1(C)c2cc(N(c3ccccc3)c3ccccc3)ccc2-c2ccc3c(c21)C(C)(C)c1cc(N(c2ccccc2)c2ccccc2)ccc1-3]

-continued
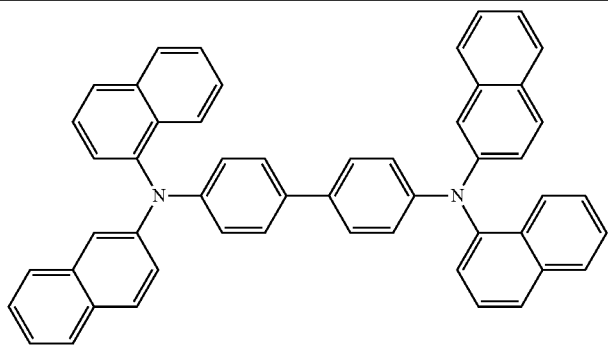
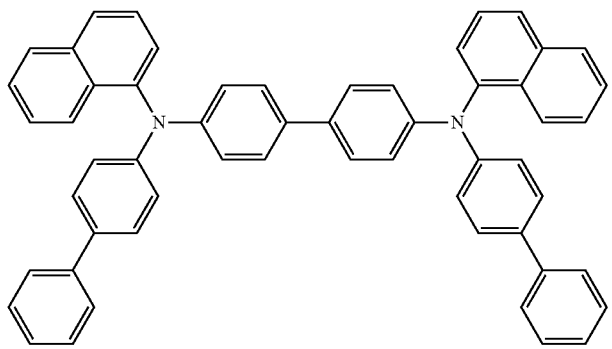 [SMILES: c1ccc(-c2ccc(N(c3ccc(-c4ccc(N(c5ccc(-c6ccccc6)cc5)c5cccc6ccccc56)cc4)cc3)c3cccc4ccccc34)cc2)cc1]
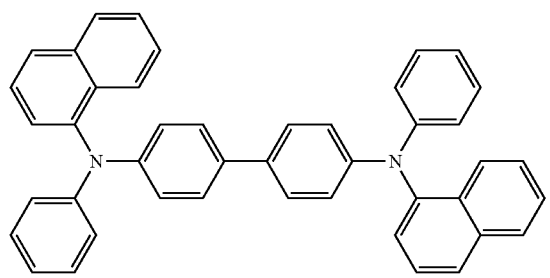 [SMILES: c1ccc(N(c2ccc(-c3ccc(N(c4ccccc4)c4cccc5ccccc45)cc3)cc2)c2cccc3ccccc23)cc1]
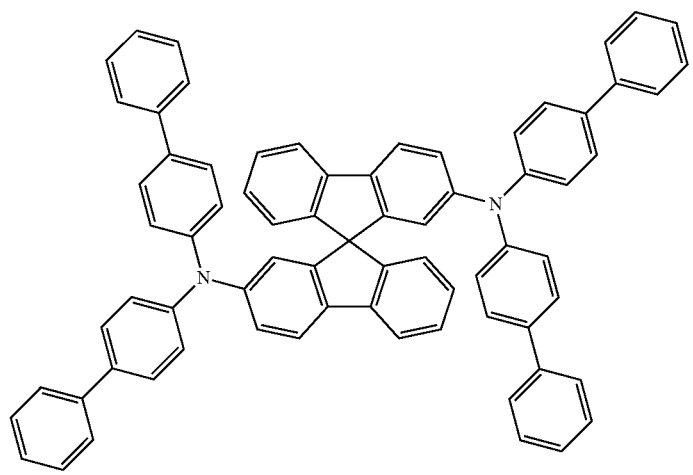 [SMILES: c1ccc(-c2ccc(N(c3ccc(-c4ccccc4)cc3)c3ccc4c(c3)C3(c5ccccc5-4)c4ccccc4-c4ccc(N(c5ccc(-c6ccccc6)cc5)c5ccc(-c6ccccc6)cc5)cc43)cc2)cc1]

-continued
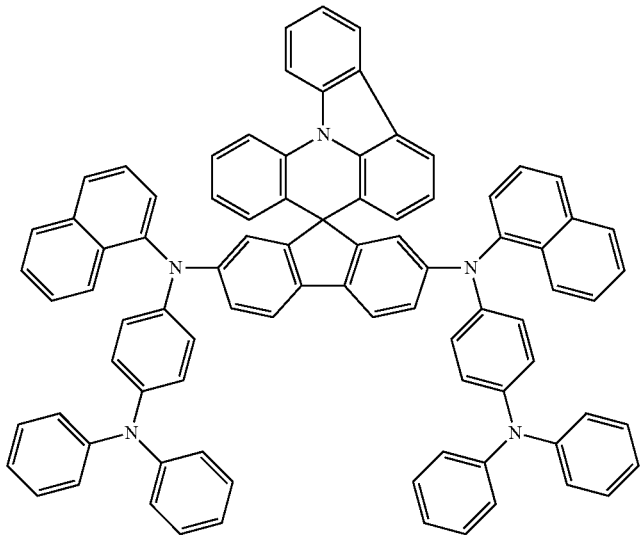 [SMILES: c1ccc(N(c2ccccc2)c2ccc(N(c3ccc4c(c3)C3(c5cc(N(c6ccc(N(c7ccccc7)c7ccccc7)cc6)c6cccc7ccccc67)ccc5-4)c4ccccc4-n4c5ccccc5c5cccc3c54)c3cccc4ccccc34)cc2)cc1]
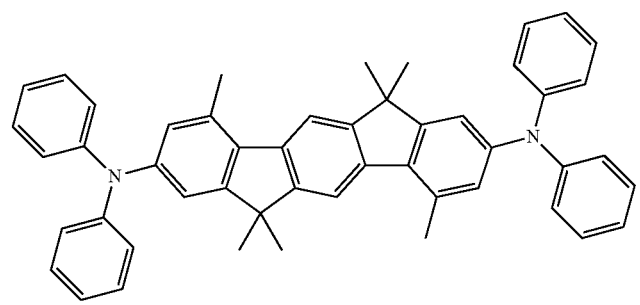 [SMILES: Cc1cc(N(c2ccccc2)c2ccccc2)cc2c1-c1cc3c(cc1C2(C)C)-c1c(C)cc(N(c2ccccc2)c2ccccc2)cc1C3(C)C]
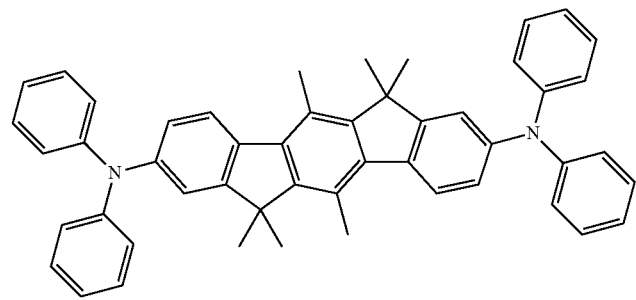 [SMILES: Cc1c2c(c(C)c3c1C(C)(C)c1cc(N(c4ccccc4)c4ccccc4)ccc1-3)C(C)(C)c1cc(N(c3ccccc3)c3ccccc3)ccc1-2]
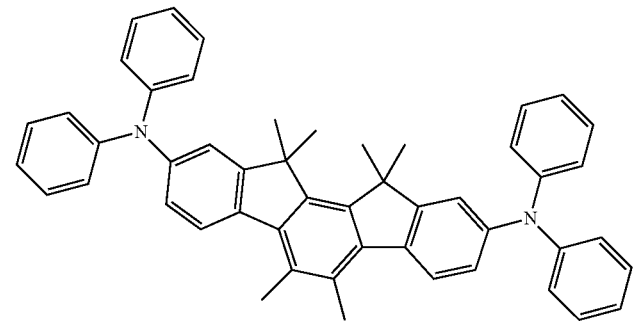 [SMILES: Cc1c(C)c2c(c3c1-c1ccc(N(c4ccccc4)c4ccccc4)cc1C3(C)C)C(C)(C)c1cc(N(c3ccccc3)c3ccccc3)ccc1-2]

Materials which can be used for the electron-transport layer are all materials as used in accordance with the prior art as electron-transport materials in the electron-transport layer. Particularly suitable are aluminium complexes, for example Alq$_3$, zirconium complexes, for example Zrq$_4$, benzimidazole derivatives, triazine derivatives, such as, for example, the materials disclosed in the unpublished application DE 102008064200.2, or aromatic ketones. Suitable materials are, for example, the materials listed in the following table. Other suitable materials are derivatives as disclosed in JP 2000/053957, WO 03/060956, WO 04/028217 and WO 04/080975.

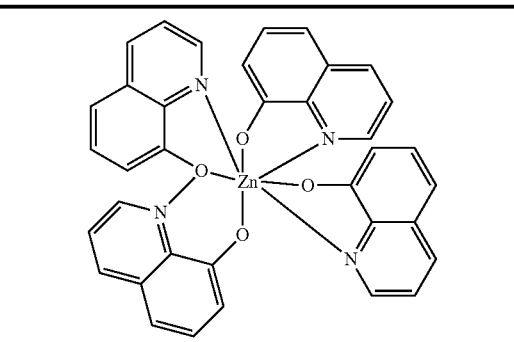

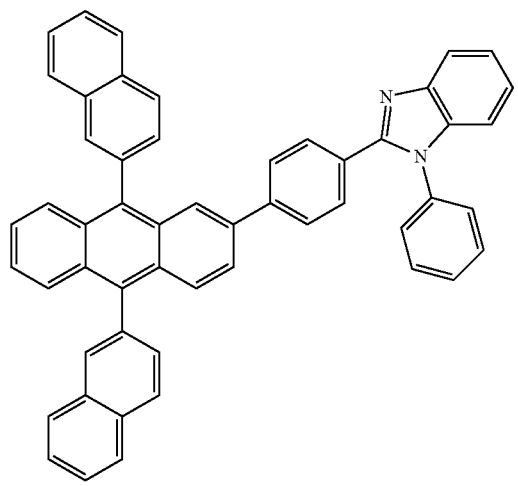 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1]

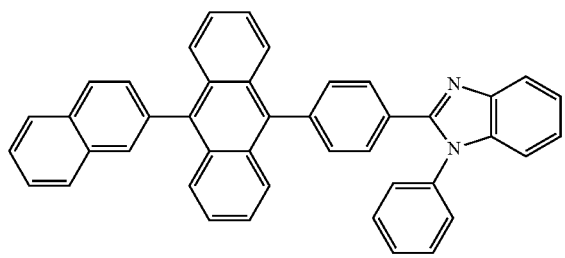 [SMILES: c1ccc(-n2c(-c3ccc(-c4c5ccccc5c(-c5ccc6ccccc6c5)c5ccccc45)cc3)nc3ccccc32)cc1]

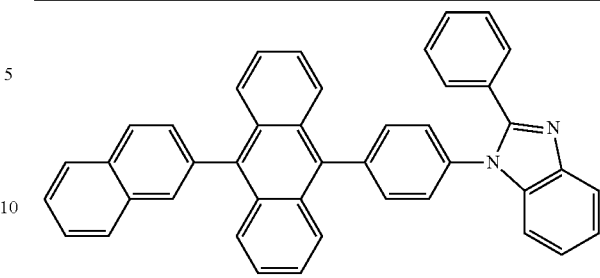

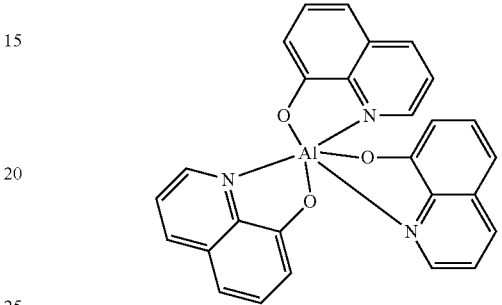

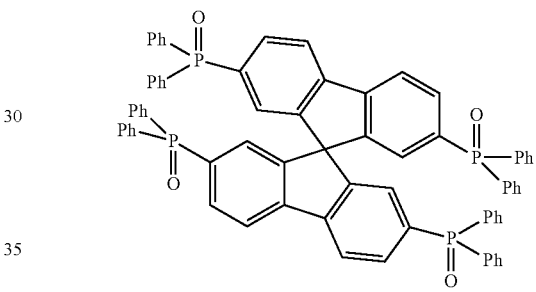

It may also be preferred to employ two separate electron-transport layers. This may have advantages with respect to the luminance dependence of the colour location of the electroluminescent device (see, for example, the unpublished application DE 102009012346.6).

It is furthermore possible for the electron-transport layer to be doped. Suitable dopants are alkali metals or alkali-metal compounds, such as, for example, LiQ (lithium quinolinate). In a preferred embodiment of the invention, the electron-transport layer is doped, in particular, when the electron-transport material is a benzimidazole derivative or a triazine derivative. The preferred dopant is then LiQ.

Preference is furthermore given to an organic electroluminescent device, characterised in that one or more layers are applied by means of a sublioration process, in which the materials are vapour-deposited in vacuum sublimation units at an initial pressure of less than $10^{-5}$ mbar, preferably less than $10^{-6}$ mbar. However, it should be noted that the pressure may also be even lower, for example less than $10^{-7}$ mbar.

Preference is likewise given to an organic electroluminescent device, characterised in that one or more layers are applied by means of the OVPD (organic vapour phase deposition) process or with the aid of carrier-gas sublimation, in which the materials are applied at a pressure between $10^{-5}$ mbar and 1 bar. A special case of this process is the OVJP (organic vapour jet printing) process, in which the materials are applied directly through a nozzle and thus structured (for example M. S. Arnold et al., *Appl. Phys. Lett.* 2008, 92, 053301).

Preference is furthermore given to an organic electroluminescent device, characterised in that one or more layers are produced from solution, such as, for example, by spin coating, or by means of any desired printing process, such as, for example, screen printing, flexographic printing or offset printing, but particularly preferably LITI (light induced thermal imaging, thermal transfer printing) or ink-jet printing. Soluble compounds are necessary for this purpose. High solubility can be achieved through suitable substitution of the compounds. It is possible here not only for solutions of individual materials to be applied, but also solutions which comprise a plurality of compounds, for example matrix materials and dopants.

The organic electroluminescent device can also be produced by applying one or more layers from solution and applying one or more other layers by vapour deposition.

These processes are generally known to the person skilled in the art and can be applied by him without inventive step to the organic electroluminescent devices according to the invention.

The organic electroluminescent device according to the invention has the following surprising advantages over the prior art:
1. The organic electroluminescent device according to the invention has very high efficiency through the use of the additional layer comprising materials A and B.
2. The organic electroluminescent device according to the invention at the same time has a very good lifetime. In particular, the lifetime is longer than on use of only material A in the additional layer or on use of a lower proportion of material A in the additional layer.
3. Furthermore, the use of the additional layer according to the invention comprising materials A and B results in a smaller increase in voltage over the lifetime of the device.

The invention is described in greater detail by the following examples without wishing to restrict it thereby. The person skilled in the art will be able, without inventive step, to carry out the invention throughout the range disclosed and thus to produce further organic electroluminescent devices according to the invention.

EXAMPLES

Example 1

Determination of HOMO, LUMO and Energy Gap from Cyclic Voltammetry and Absorption Spectrum The HOMO and LUMO values and the energy gap in the sense of the present invention are determined by the general methods described below:

The HOMO value arises from the oxidation potential, which is measured at room temperature by means of cyclic voltammetry (CV). The measuring instrument used for this purpose is an ECO Autolab System with Metrohm 663 VA stand. The working electrode is a gold electrode, the reference electrode is Ag/AgCl, the intermediate electrolyte is KCl (3 mol/l) and the auxiliary electrode is platinum.

For the measurement, firstly a 0.11 M conductive-salt solution comprising tetrabutylammonium hexafluorophosphate ($NH_4PF_6$) in dichloromethane is prepared, introduced into the measurement cell and degassed for 5 min. Two measurement cycles are subsequently carried out with the following parameters:
Measurement technique: CV
Initial purge time: 300 s
Cleaning potential: −1 V
Cleaning time: 10 s
Deposition potential: −0.2 V
Deposition time: 10 s
Start potential: −0.2 V
End potential: 1.6 V
Voltage step: 6 mV
Sweep rate: 50 mV/s 1 ml of the sample solution (10 mg of the substance to be measured in 1 ml of dichloromethane) is subsequently added to the conductive-salt solution, and the mixture is again degassed for 5 min. Five further measurement cycles are subsequently carried out, of which the last three are recorded for the evaluation. The same parameters are set here as described above.

0.1 ml of ferrocene solution (100 mg of ferrocene in 1 ml of dichloromethane) is subsequently added to the solution, the mixture is degassed for 1 min, and a measurement cycle is carried out with the following parameters:
Measurement technique: CV
Initial purge time: 60 s
Cleaning potential: −1 V
Cleaning time: 10 s
Deposition potential: −0.2 V
Deposition time: 10 s
Start potential: −0.2 V
End potential: 1.6 V
Voltage step: 6 mV
Sweep rate: 50 mV/s For the evaluation, the average of the voltages at the first oxidation maximum for both the sample solution and the solution to which ferrocene solution has been added is taken from the forward curves and the average of the voltages at the associated reduction maximum is taken from the reverse curves ($V_P$ and $V_F$), where the voltage used is in each case the voltage against ferrocene. The HOMO value of the substance to be investigated, $E_{HOMO}$, is obtained from $E_{HOMO}=-[e\cdot(V_P-V_F)+4.8\ eV]$, where e represents the elementary charge.

It should be noted that it may be necessary in individual cases to carry out appropriate modifications of the measurement method, for example if the substance to be investigated cannot be dissolved in dichloromethane or if decomposition of the substance occurs during the measurement. If an appropriate measurement by means of CV using the above-mentioned method should be impossible, the HOMO energy is determined by photoelectron spectroscopy using a model AC-2 photoelectron spectrometer from Riken Keiki Co. Ltd. (http://www.rikenkeiki.com/pages/AC2.htm), in which case it must be noted that the values obtained are typically about 0.3 eV lower than those measured using CV. The HOMO value in the sense of this patent is then taken to mean the value from Riken AC2+0.3 eV.

Furthermore, HOMO values which are lower than −6 eV cannot be measured reliably either using the CV method described or using the photoelectron spectroscopy described. In this case, the HOMO values are determined from quantum-chemical calculation by means of density functional theory (DFT). This is carried out using the commercially available software Gaussian 03W (Gaussian Inc.), using method B3PW91/6-31G(d). Standardisation of the calculated values to CV values is achieved by comparison with materials which can be measured using CV. To this end, the HOMO values of a series of materials are measured using the CV method and likewise calculated. The calculated values are then calibrated by means of the measured values, and this calibration factor is used for all further calculations. In this way, HOMO values which correspond very well to those measured using CV can be calculated. If the HOMO value of a certain substance cannot be measured as described above using CV or Riken AC2, the HOMO value in the sense of this patent is therefore taken to mean the value which is obtained in accordance with the description by a DFT calculation calibrated to CV, as described above. Examples of values calculated in this way for some common organic materials are: NPB (HOMO −5.16 eV, LUMO −2.28 eV); TCTA (HOMO −5.33 eV, LUMO −2.20 eV); TPBI (HOMO −6.26 eV, LUMO −2.48 eV). These values can be used for calibration of the calculation method.

The energy gap is determined from the absorption edge of the absorption spectrum measured on a film having a layer thickness of 50 nm. The absorption edge is defined here as the wavelength obtained when a straight line is fitted to the longest-wavelength falling flank in the absorption spectrum at its steepest point, and the value at which this straight line intersects the wavelength axis, i.e. the absorption value=0, is determined.

The LUMO value is obtained by addition of the energy gap to the HOMO value described above.

Example 2

Production and Characterisation of Organic Electroluminescent Devices in Accordance with the Invention Electroluminescent devices according to the invention can be produced, for example, by the process described in WO 05/003253.

The structures of the materials used are depicted below for clarity.

HIM

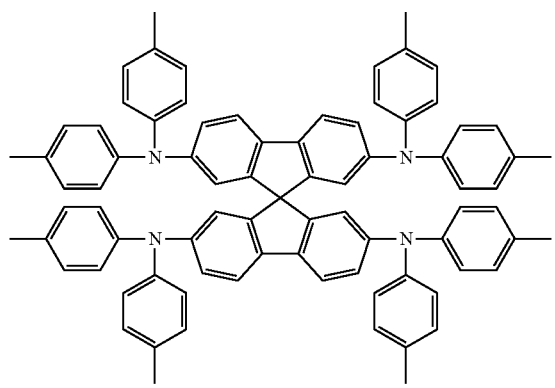

NPB

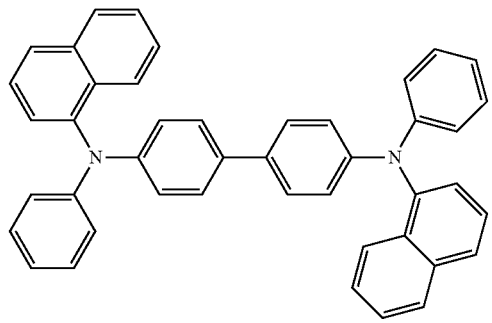

HTM1

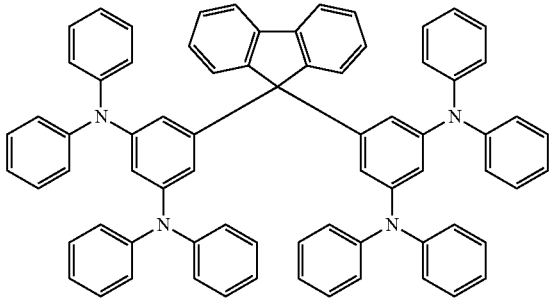

TER

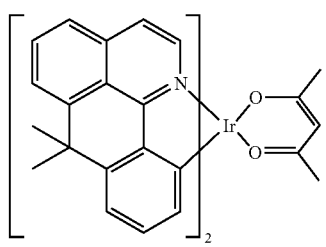

SK

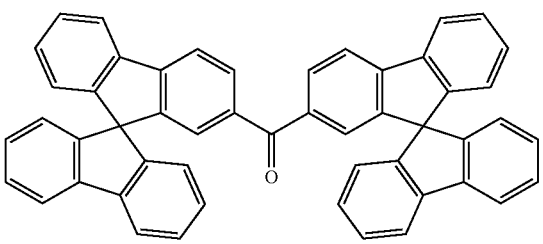

TMM

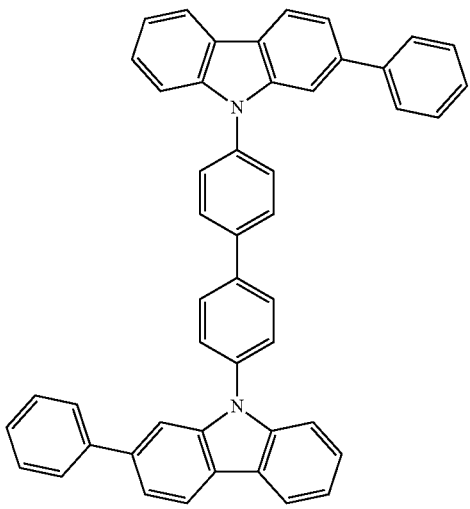

TEG

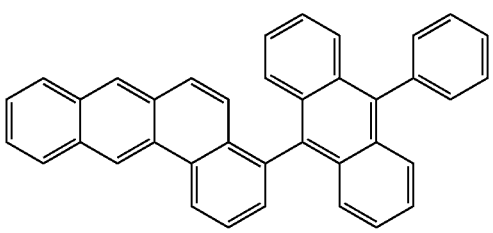

BH

BD

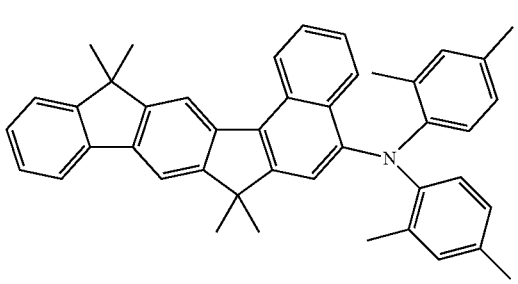

ETM

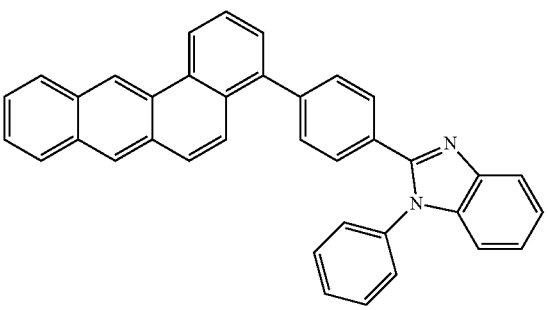

These as yet unoptimised OLEDs are characterised by standard methods; for this purpose, the electroluminescence spectra and colour coordinates (in accordance with CIE 1931), the efficiency (measured in cd/A) as a function of the luminance, the operating voltage, calculated from current-voltage-luminous density characteristic lines (IUL characteristic lines), and the lifetime are determined. The results obtained are summarised in Table 1.

The results for various OLEDs are compared below. These are monochromic or white OLEDs, each with a variant (a) with a conventional structure in accordance with the prior art and a second variant (b) comprising an additional layer according to the invention.

Example 3

Example 3 is achieved through the following layer structure: 150 nm of HIM, 20 nm of NPB, 5 nm of BD doped with 5% of BH (only in the case of variant 3b), 20 nm of BH doped with 5% of BD, 30 nm of ETM, 1 nm of LiF, 100 nm of Al.

Example 3 relates to fluorescent blue OLEDs. OLED 3b according to the invention has similar values for colour, efficiency, operating voltage and lifetime as OLED 3a. However, it exhibits a significant improvement in the increase in voltage during operation. The increase in voltage measured up to the point at which the luminous density has dropped from 1000 cd/m$^2$ to 500 cd/m$^2$ in constant current mode is approximately a factor of 3 lower in Example 3b than in Comparative Example 3a.

Example 4

Example 4 is achieved through the following layer structure: 50 nm of HIM, 40 nm of NPB doped with 7% of TER, 7 nm of a mixed layer consisting of 70% of TMM, 15% of SK and 15% of TEG, 3 nm of HTM1 doped with 20% of SK, 3 nm of BD doped with 20% of BH (only in the case of variant 4b), 25 nm of BH doped with 5% of BD, 10 nm of SK, 20 nm of ETM, 1 nm of LiF, 100 nm of Al.

The OLEDs of example 4 are hybrid-white OLEDs. Here too, OLEDs 4a and 4b exhibit similar values with respect to colour, efficiency and operating voltage. An improvement in the increase in voltage during operation likewise arises on use of the additional layer according to the invention, albeit to a reduced extent compared with Example 3. However, a significant improvement additionally arises here in the operating lifetime, which is more than twice as long in the case of the OLED according to the invention as in the case of the comparative OLED.

TABLE 1

Device results

| Ex. | Efficiency [cd/A] at 1000 cd/m² | Voltage [V] at 1000 cd/m² | CIE x/y at 1000 cd/m² | Lifetime to 50% [h], at 1000 cd/m² initial luminance | Increase in voltage [V] after lifetime 50% |
|---|---|---|---|---|---|
| 3a (cmp.) | 7.1 | 5.0 | 0.14/0.14 | 5400 | 0.25 |
| 3b | 6.8 | 5.2 | 0.14/0.14 | 4700 | 0.08 |
| 4a (cmp.) | 15.8 | 4.5 | 0.28/0.28 | 4200 | 0.50 |
| 4b | 15.4 | 4.2 | 0.28/0.28 | 9600 | 0.38 |

The invention claimed is:

1. An organic electroluminescent device which comprises an emitting layer which consists of a mixture of at least two materials A and B in an unequal mixing ratio, where the concentration of material A is lower than the concentration of material B, and which comprises an additional layer which is a non-luminous layer and which consists of a mixture of the same materials A and B as the emitting layer, wherein material A, which has the lower proportion of the two materials in the emitting layer, is present in a higher proportion than material B in this additional layer, wherein the material A has a concentration of less than 30% by vol. in the emitting layer and the material B has a proportion of greater than 70% by vol. in the emitting layer, wherein the proportion of material A in the additional layer which comprises the same materials A and B as the emitting layer is greater than 80% by vol. and in that the proportion of material B is less than 20% by vol. and wherein the material B is a compound of the following formula (8):

Ar⁴-Ant-Ar⁴  formula (8)

where $R^1$ is on each occurrence, identically or differently, H, D, F, Cl, Br, I, CHO, C(=O)Ar³, P(=O)(Ar³)₂, S(=O)Ar³, S(=O)₂Ar³, CR²=CR²Ar³, CN, NO₂, Si(R²)₃, B(OR²)₂, B(R²)₂, B(N(R²)₂)₂, OSO₂R², a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals $R^2$, where one or more non-adjacent CH₂ groups may be replaced by R²C=CR², C≡C, Si(R²)₂, Ge(R²)₂, Sn(R²)₂, C=O, C=S, C=Se, C=NR², P(=O)(R²), SO, SO₂, NR², O, S or CONR² and where one or more H atoms may be replaced by F, Cl, Br, I, CN or NO₂, or an aromatic or heteroaromatic ring system having 5 to 60 aromatic ring atoms, which may in each case be substituted by one or more radicals $R^2$, or an aryloxy or heteroaryloxy group having 5 to 60 aromatic ring atoms, which may be substituted by one or more radicals $R^2$, or a combination of these systems; two or more adjacent substituents $R^1$ here may also form a mono- or polycyclic, aliphatic or aromatic ring system with one another;

Ar³ is on each occurrence, identically or differently, an aromatic or heteroaromatic ring system having 5 to 40 aromatic ring atoms, which may be substituted by one or more radicals $R^2$;

$R^2$ is on each occurrence, identically or differently, H, D, CN or an aliphatic, aromatic and/or heteroaromatic hydrocarbon radical having 1 to 20 C atoms, in which, in addition, H atoms may be replaced by F; two or more adjacent substituents $R^2$ here may also form a mono- or polycyclic, aliphatic or aromatic ring system with one another and the following applies to the other symbols used:

Ant stands for an anthracene group which is substituted in the 9- and 10-position by the groups Ar⁴ and which may furthermore be substituted by one or more substituents $R^1$;

Ar⁴ is, identically or differently on each occurrence, an aromatic or heteroaromatic ring system having 5 to 60 aromatic ring atoms, which may be substituted by one or more radicals $R^1$.

2. The organic electroluminescent device according to claim 1, wherein the material A is an emitting material.

3. The organic electroluminescent device according to claim 1, wherein the material A is a fluorescent material.

4. The organic electroluminescent device according claim 1, wherein the material A has a concentration of less than 7% by vol. in the emitting layer.

5. The organic electroluminescent device according to claim 1, wherein the emitting layer consists of precisely one host material B which is doped with precisely one emitting dopant A.

6. The organic electroluminescent device according to claim 1, wherein the emitting layer consists of precisely one host material B which is doped with precisely one emitting dopant A, where the concentration of host material B is greater than 93% by vol.

7. The organic electroluminescent device according to claim 1, wherein the additional layer is directly adjacent to the emitting layer, on the anode side.

8. The organic electroluminescent device according to claim 1, wherein the material A is a hole-transport material having an HOMO of >−5.6 eV.

9. The organic electroluminescent device according to claim 1, wherein the material B is an electron-transporting material having an LUMO of <−2.3 eV.

10. The organic electroluminescent device according to claim 1, wherein the layer thickness of the emitting layer is between 5 and 60 nm.

11. The organic electroluminescent device according to claim 1, wherein the layer thickness of the additional layer which comprises the same materials as the emitting layer is between 1 and 50 nm.

12. The organic electroluminescent device according to claim 1, wherein the layer thickness of the emitting layer is between 10 and 30 nm and the layer thickness of the additional layer which comprises the same materials as the emitting layer is between 3 and 20 nm.

13. A process for the production of an organic electroluminescent device according to claim 1, which comprises applying one or more layers by a) means of a sublimation process, b) means of the OVPD (organic vapour phase deposition) process, c) with the aid of carrier-gas sublimation or d) in that one or more layers are applied from solution or by means of a printing process.

14. The organic electroluminescent device according to claim 1, wherein the material A employed is a compound of the following formulae (1) to (7):

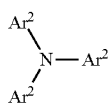

formula (1)

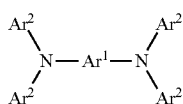

formula (2)

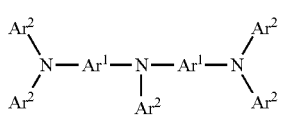

formula (3)

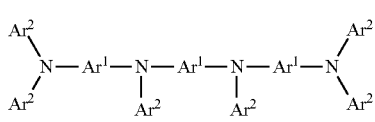

formula (4)

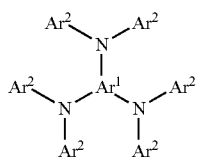

formula (5)

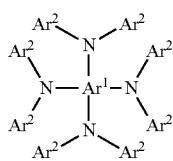

formula (6)

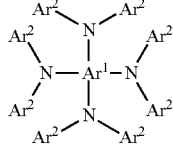

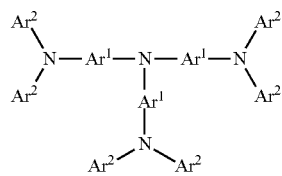

formula (7)

where the following applies to the symbols used:

$Ar^1$ is on each occurrence, identically or differently, a divalent, trivalent or tetravalent aromatic or heteroaromatic ring system having 5 to 60 aromatic ring atoms, which may be substituted by one or more radicals $R^1$;

$Ar^2$ is on each occurrence, identically or differently, a monovalent aromatic or heteroaromatic ring system having 5 to 60 aromatic ring atoms, which may be substituted by one or more radicals $R^1$; two groups $Ar^2$ here which are bonded to the same nitrogen atom or one group $Ar^1$ with one group $Ar^2$ which are bonded to the same nitrogen atom may be linked to one another by a single bond or a bridge selected from the group consisting of $B(R^1)$, $C(R^1)_2$, $Si(R^1)_2$, $C=O$, $C=NR^1$, $C=C(R^1)_2$, $O$, $S$, $S=O$, $SO_2$, $N(R^1)$, $P(R^1)$ and $P(=O)R^1$;

$R^1$ is on each occurrence, identically or differently, H, D, F, Cl, Br, I, CHO, $C(=O)Ar^3$, $P(=O)(Ar^3)_2$, $S(=O)Ar^3$, $S(=O)_2Ar^3$, $CR^2=CR^2Ar^3$, CN, $NO_2$, $Si(R^2)_3$, $B(OR^2)_2$, $B(R^2)_2$, $B(N(R^2)_2)_2$, $OSO_2R^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals $R^2$, where one or more non-adjacent $CH_2$ groups may be replaced by $R^2C=CR^2$, $C\equiv C$, $Si(R^2)_2$, $Ge(R^2)_2$, $Sn(R^2)_2$, $C=O$, $C=S$, $C=Se$, $=NR^2$, $P(=O)(R^2)$, SO, $SO_2$, $NR^2$, O, S or $CONR^2$ and where one or more H atoms may be replaced by F, Cl, Br, I, CN or $NO_2$, or an aromatic or heteroaromatic ring system having 5 to 60 aromatic ring atoms, which may in each case be substituted by one or more radicals $R^2$, or an aryloxy or heteroaryloxy group having 5 to 60 aromatic ring atoms, which may be substituted by one or more radicals $R^2$, or a combination of these systems; two or more adjacent substituents R' here may also form a mono- or polycyclic, aliphatic or aromatic ring system with one another;

$Ar^3$ is on each occurrence, identically or differently, an aromatic or heteroaromatic ring system having 5 to 40 aromatic ring atoms, which may be substituted by one or more radicals $R^2$;

$R^2$ is on each occurrence, identically or differently, H, D, CN or an aliphatic, aromatic and/or heteroaromatic hydrocarbon radical having 1 to 20 C atoms, in which, in addition, H atoms may be replaced by F; two or more adjacent substituents $R^2$ here may also form a mono- or polycyclic, aliphatic or aromatic ring system with one another and wherein the at least one of the groups $Ar^1$ and/or $Ar^2$ in compounds of the formulae (1) to (7) represents a condensed aromatic or heteroaromatic ring system having more than 10 aromatic ring atoms.

15. The organic electroluminescent device according to claim 1, which further comprises a hole transporting layer.

* * * * *